United States Patent [19]

Miller et al.

[11] Patent Number: 5,596,298
[45] Date of Patent: Jan. 21, 1997

[54] BUS ALIGNED QUADRATURE FM DETECTOR

[75] Inventors: Rick W. Miller; Daniel M. Hutchinson, both of Carmel, Ind.

[73] Assignee: Thomson Consumer Electronics, Inc., Indianapolis, Ind.

[21] Appl. No.: 418,140

[22] Filed: Apr. 5, 1995

[51] Int. Cl.[6] .................................................. H03D 3/06
[52] U.S. Cl. ........................ 329/337; 455/214; 455/337
[58] Field of Search ................................... 329/336, 337; 455/214, 337

[56] References Cited

U.S. PATENT DOCUMENTS

| | | | |
|---|---|---|---|
| 3,651,418 | 3/1972 | Wittmann | 329/50 |
| 3,922,483 | 11/1975 | Indri | 348/735 |
| 4,127,825 | 11/1978 | Blomley | 329/103 |
| 4,198,609 | 4/1980 | Ishigaki et al. | 329/337 |
| 4,286,237 | 8/1981 | James | 332/19 |
| 4,375,618 | 3/1983 | Jett, Jr. | 329/103 |
| 4,402,089 | 8/1983 | Knight et al. | 455/186 |
| 4,511,924 | 4/1985 | Griffis et al. | 358/197 |
| 4,567,441 | 1/1986 | Main | 329/103 |
| 4,620,226 | 10/1986 | Cheung | 358/143 |
| 4,685,150 | 8/1987 | Maier | 455/183 |
| 5,280,638 | 1/1994 | Porambo et al. | 455/143 |
| 5,315,262 | 5/1994 | Schulz | 329/302 |
| 5,428,404 | 6/1995 | Ingram et al. | 329/337 |
| 5,453,714 | 9/1995 | Madsen | 329/337 |

OTHER PUBLICATIONS

Applications Note AN-382 From National Semiconductor Linear Applications Handbook, 1986, pp. 973–985 No month.
LM-1211 Data Sheet From National Semiconductor Special Purposes Linear Devices DataBook, 1989 pp. 2-8 to 2-17 No month.

*Primary Examiner*—Siegfried H. Grimm
*Attorney, Agent, or Firm*—Joseph S. Tripoli; Peter M. Emanuel; Frederick A. Wein

[57] ABSTRACT

In a quadrature FM detector, demodulation is performed by a product detector which multiplies an amplitude limited FM modulated information signal by a version of the amplitude limited FM modulated information signal which has been phase shifted by a phase shifting network including a single tuned LC circuit. In order to assure that the LC circuit is tuned to the carrier frequency of the FM signal, the LC circuit is tuned by a variable impedance device in response to a control signal generated by a bus controlled DAC. The control signal is coupled to the variable impedance device at the same pin of an integrated circuit where the LC circuit is coupled to the demodulator.

7 Claims, 3 Drawing Sheets

5,596,298

1

BUS ALIGNED QUADRATURE FM DETECTOR

BACKGROUND OF THE INVENTION

Frequency Modulation (FM) detection, using a so called quadrature detector, is well known. This kind of FM detector typically is a four quadrant multiplier with one input terminal driven by an amplitude limited FM modulated information signal (reference signal), and another input terminal driven with a version of the reference signal which is quadrature (90°) phase shifted relative to the reference signal using a tuned circuit including an RLC network. With a single tuned circuit, the resultant transfer characteristic of the detector, while closely approximating a straight line near the center (carrier) frequency of the modulated signal, departs from a straight line when the frequency of the FM signal deviates appreciably. Because of the wide deviation of a conventional FM broadcast signal (±75 KHz), the departure from a straight line introduces harmonic distortion, particularly for louder audio signals.

The slope of the phase versus frequency curve of the tuned circuit is determined by its "Q". Distortion can be reduced by lowering the "Q" but this reduces the output signal level so that a reduced signal-to-noise (S/N) ratio results. This means that the quadrature FM detector requires a linearity versus sensitivity trade-off between total harmonic distortion (THD) and S/N.

Tolerances in the values of the inductance and capacitance of the tuned circuit can result in a phase versus frequency curve that is not centered at the FM carrier frequency. Although the demodulator will still function under such non-ideal conditions, less of the linear portion of the phase curve will be available and the THD will be degraded. This degradation of THD can be compensated for by lowering the "Q" of the tuned circuit. However, as stated above, the result would be to degrade S/N performance. In order to optimize THD while still maintaining a reasonably high "Q" for good S/N, an alignment of the tuned circuit is desirable so that it is accurately tuned to the FM carrier frequency. Current manufacturing processes and apparatus control systems make it desirable that such an alignment be performed electronically since the operation of currently produced apparatus, e.g., television receivers and the like, are typically bus controlled under the control of a programmed microprocessor and a PROM memory.

SUMMARY OF THE INVENTION

Briefly, in a quadrature FM detector, phase detection is performed by multiplication of an amplitude limited FM information signal (reference signal) with a version of the reference signal which has been phase shifted by a phase shifting circuit including a tuned LC circuit. In order to assure that the LC circuit is tuned to the carrier frequency, the LC circuit includes a varactor diode which is tuned by a control voltage generated by a DAC under the control of a programmed computer via a data bus. The control voltage is coupled from the DAC to the varactor diode via the same pin of the integrated circuit to which the LC circuit is coupled to the FM detector.

2

Figure 1:
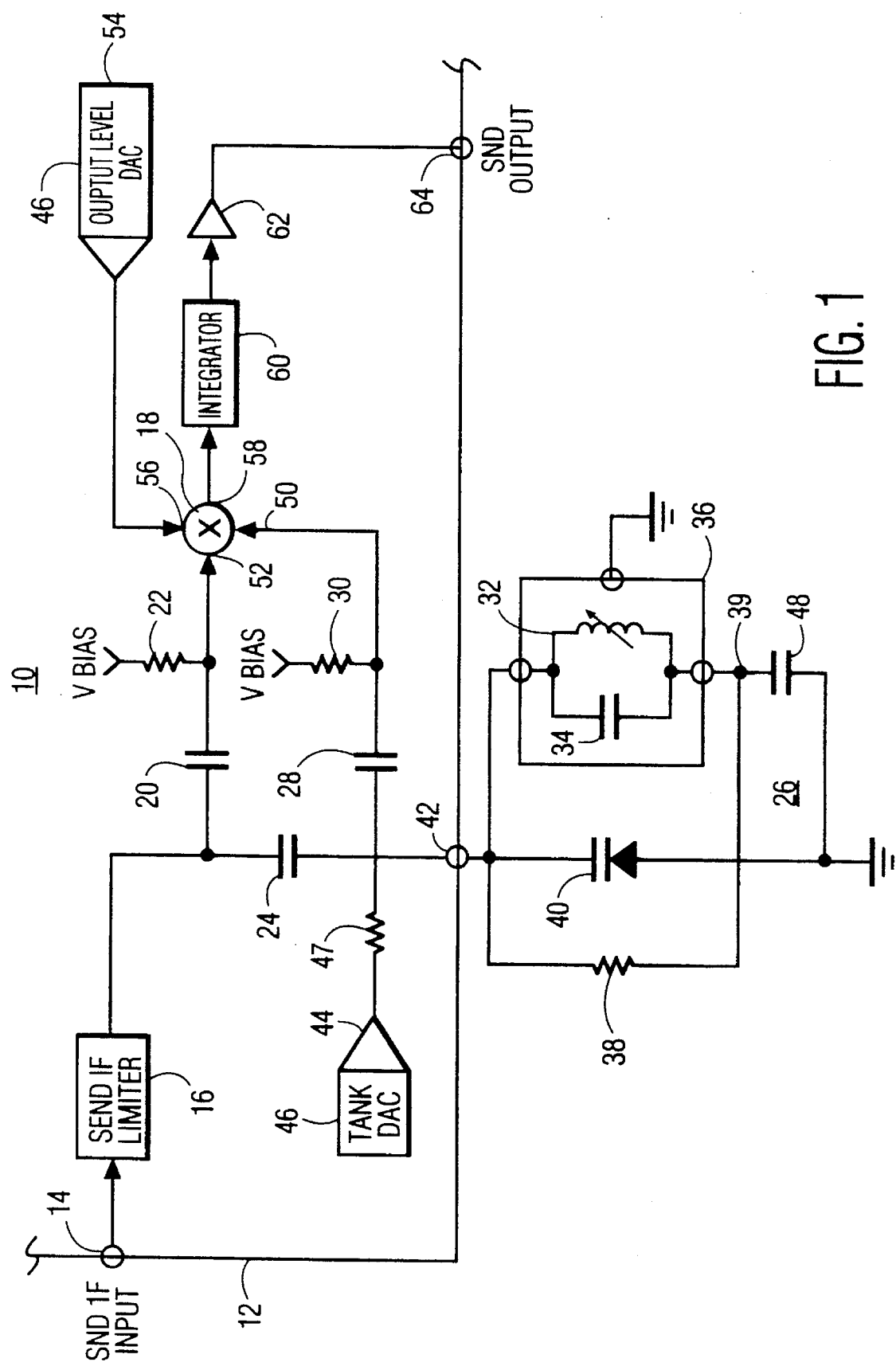
FIG. 1 shows, partially in block diagram form and partially in schematic form, a quadrature FM detector according to aspects of the present invention.
Figure 2:
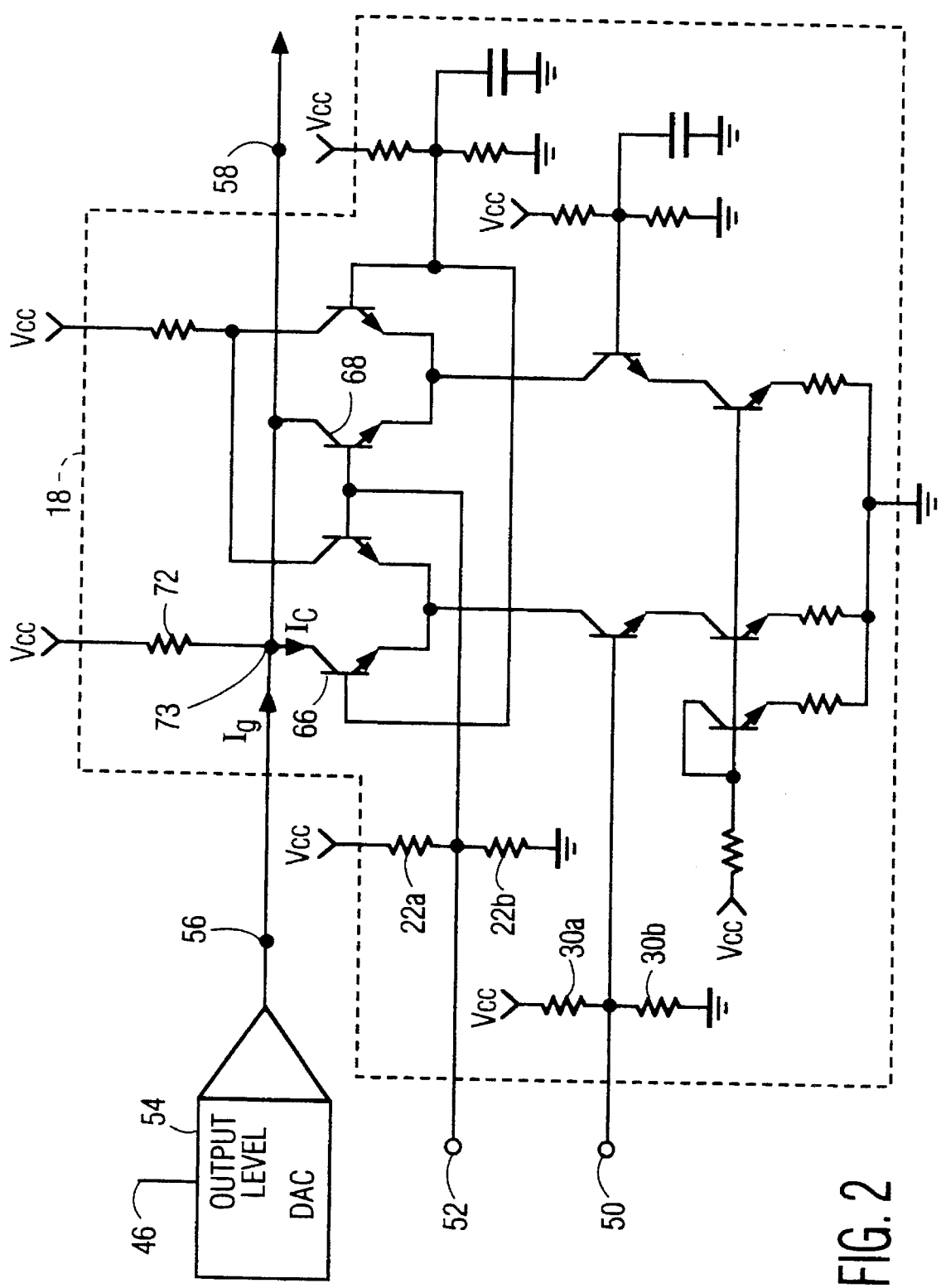

FIG. 2 is a schematic of the product detector of FIG. 1.

Figure 3:
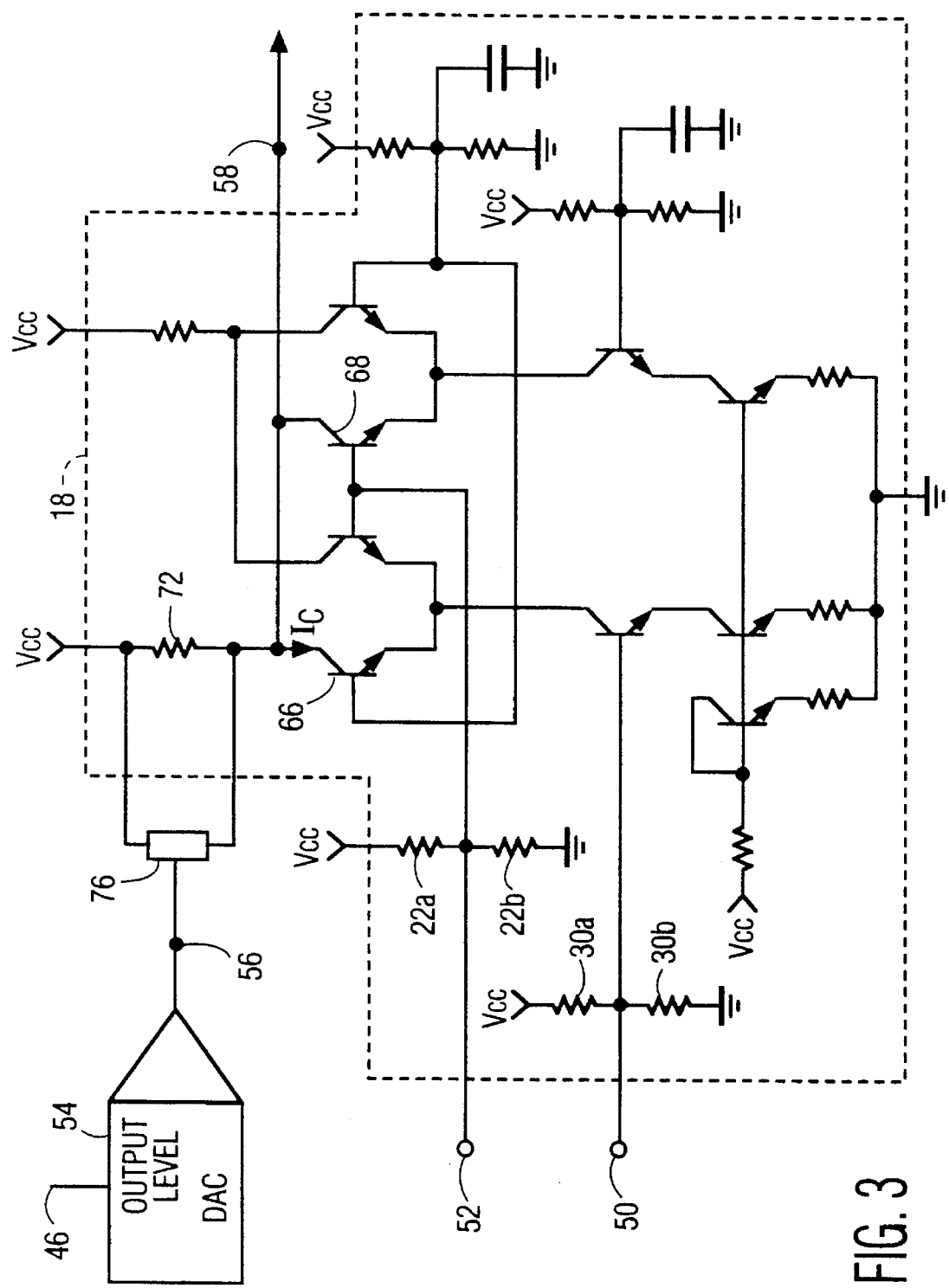

FIG. 3 is an alternate embodiment of the product detector of FIG. 2.

DETAILED DESCRIPTION OF THE PREFERRED EMBODIMENT

Referring to FIG. 1, an FM modulated information signal, which in the exemplary embodiment is the 4.5 MHz (U.S.) intercarrier sound signal of a television receiver, is coupled to input terminal pin 14 of integrated circuit (IC) 12. This FM modulated information signal is amplitude limited by limiter 16 and is coupled, via series capacitor 20 (30 picofards) and shunt resistor 22 (10 Kohms), to an input terminal 52 of a four quadrant product detector 18, which in the exemplary embodiment, is a Gilbert cell. A quadrature signal, which is 90 degree phase shifted with respect to the signal coupled to input terminal 52 (reference signal), is coupled to a second input terminal 50 of detector 18 via a phase shift network of series capacitor 24 (7 picofards), RLC tank circuit 26 coupled between IC terminal pin 42 and ground, series capacitor 28 (50 picofards), and shunt resistor 30 (10 Kohms). A bias voltage is also provided to input terminals 52, 50 via respective resistors 22 and 30.

Tank circuit 26 includes an adjustable inductance (L) 32 in parallel with a fixed capacitance (C) 34. LC circuit 32,34 is a purchased unit manufactured by the Sony Company, part No. 1T363, and is provided in a shielded container 36, which is grounded. In the exemplary embodiment, capacitor 34 is 75 picofards and inductance 32 is 12 microhenries. This unit is tuned to within 1 percent of 5.3 MHz. Resistor 38 is coupled across LC circuit 32,34, and with an exemplary value of 5 Kohms, provides a circuit "Q" of about 8.5.

Varactor diode 40 is coupled in parallel with LC circuit 32,34 in order to accurately adjust the tuned frequency of tank circuit 26 to 4.5 MHz. Diode 40 is adjustable between 13 and 33 picofarads by a control voltage, generated by DAC 44, which is applied to the anode of diode 40 via isolation resistor 47. In the exemplary embodiment, the adjustment range of diode 40 is limited by the range of control voltages available from DAC 44. When LC circuit 32,34 is used with a varactor diode, the value of capacitor 34 is added to the capacitance of varactor diode 40 and the sum of the two capacitances tunes tank 26 to 4.5 MHz.

The control voltage generated by DAC 44 is coupled to varactor 40 via the same pin 42 used to couple tank 26 to the other members of demodulator 10 disposed on IC 12. The control voltage generated by DAC 44 is responsive to control signals received via bus 46, under the control of a microprocessor or microcomputer (not shown). Each DAC discussed herein is associated with a bus decoder for determining which data is addressed to the particular DAC, and for decoding the bus data into plural data lines for applicaton to the DAC ladder. For simplicity of illustration, the bus decoder for the respective DACs discussed herein is not shown. The bus of the exemplary embodiment is $I^2C$ but any applicable bus, such as an IM bus, can be used.

In order to prevent the control voltage across varactor diode 40 from being shunted to ground by inductance 32, a DC blocking capacitor 48 is connected in series with the LC circuit 32,34 at node 39. For the same reason, resistor 38 is also returned to node 39. However, since the resistance of resistor 38 is much larger than the DC resistance of inductance 32, returning resistor 38 to node 39 is optional, and it may be returned to ground. Additionally, DC blocking capacitor 48 also permits the use of an inductive component which is not intended to pass DC current since the additional magnetic flux due to such a current would have to be taken into account in the design of inductance 32. Thus, the designer has greater flexibility in the choice of components.

When tank circuit 26 is tuned to the carrier frequency of the FM signal, it is resistive at the tuned frequency. In this manner, the signal coupled to terminal 50 via capacitor 24, tank circuit 26, capacitor 28 and resistor 30 is 90 degrees shifted from the reference signal coupled to terminal 52 via capacitor 20 and resistor 22, which add some phase shift to the reference signal path.

The detected output information signal at terminal 58 of product detector 18 is a square wave (train of pulses) at the frequency of the FM carrier but with the duty cycle of the square wave being a function of the frequency deviation of the carrier. The demodulated information signal is recovered from the duty cycle variation by an integrator 60 (low pass network) which can be any suitable active or passive network, and is coupled via amplifier 62 to IC sound output terminal 64.

Referring now to FIG. 2, there is shown a detailed schematic of the Gilbert cell product detector 18 based upon the Gilbert cell product detector described on page 177 of "Solid State Radio Engineering" by Herbert K. Krause et al., published by the Wiley Company, Copyright 1980. For the purposes of FIG. 2, resistors 22a,22b and 30a,30b can be considered equivalents of respective resistors 22, 30 of FIG. 1.

Detector 18 is driven in an unbalanced configuration by unbalanced signals at terminals 50,52. Resistor 72 is coupled between Vcc and the collector electrodes of the transistors 66, 68 which are connected together at node 73. The demodulated output signal at terminal 58 is derived across load resistor 72 and corresponds to the currents flowing through resistor 72. Output level DAC 54, under computer control via bus 46, generates an output level control signal, current Ig, which is coupled to node 73 via terminal 56. In the absence of any signal from DAC 54, current Ic of transistor 66, flowing through resistor 72, determines the amplitude of the demodulated pulse output signal. Transistor 66 is a current sink. As current Ig is provided by DAC 54 to node 73, less signal current is drawn through resistor 72 for the same Ic though transistor 66. Consequently, the voltage drop across resistor 72 is decreased, and the lower level of the output signal square wave at terminal 58 will rise towards Vcc. Similarly, the lower level of the output signal square wave will decrease (move further away from Vcc) as Ig decreases and a larger percentage of Ic flows through resistor 72. This relationship is described by the following equation, where $R_L$ is resistor 72 and Vo is the voltage at terminal 58:

Vo=Vcc+i$R_L$ where i=Ig−Ic and |Ic|>|Ig|

Thus, the peak level of the output signal square wave at terminal 58 is Vcc and the lower level of the output signal square wave is Vcc minus Vo. In this manner, the peak-to-peak amplitude of the output signal square wave is adjusted in response to the output current Ig of DAC 54, as determined by the digital data on bus 46.

In an alternate embodiment shown in FIG. 3, the collector-emitter path of a bipolar transistor or the drain-source path of a field effect transistor (FET) is coupled in parallel with load resistor 72. These devices are shown in FIG. 3 as a block member with the numerical designation 76. The control electrode of transistor 76 is coupled to input terminal 56 to receive the control signals from DAC 54. The impedance of parallel circuit 72,76 is adjustable in response to the control signal applied to the control electrode. When the total impedance of the parallel circuit 72,76 is reduced, collector current Ic of transistor 66 will generate a lower voltage across the lower impedance value. Alternately, when the impedance of parallel circuit 72,76 is maximum, i.e., the conduction path of transistor 76 has maximum impedance, the peak-to-peak square wave output voltage generated by the same Ic will be maximum.

Demodulator 10 has a variety of uses, e.g., in FM radios and television receivers including VCRs for demodulating the FM IF sound signal to produce an audio signal, or in VCRs for demodulating the video luminance signal which, in VHS format, is FM recorded onto the tape.

What is claimed is:

1. A demodulator circuit disposed on an integrated circuit, comprising:

first signal means for providing a first signal modulated with information;

control means disposed on the integrated circuit for generating a control voltage;

second signal means for providing a second signal which is phase adjustable with respect to the first signal by an LC circuit, the LC circuit being disposed external of the integrated circuit and coupled to a terminal of the integrated circuit, the LC circuit being tunable by a variable impedance disposed external of the integrated circuit and coupled to the terminal, the variable impedance being responsive to the control voltage present at the terminal to change the phase of the second signal to a predetermined phase relationship with respect to the first signal;

product detector means for providing an output signal responsive to the phase relationship of the first signal with respect to the second signal, the product detector means being disposed on the integrated circuit, the output signal including demodulated information.

2. The demodulator circuit of claim 1 wherein the control means generates the control voltage in response to an electronic programmed means.

3. The demodulator circuit of claim 1 wherein the control means includes a DAC.

4. The demodulator circuit of claim 1 wherein the LC circuit is a capacitance and an inductance coupled in parallel and the variable impedance includes a varactor diode coupled in parallel with the LC circuit.

5. The demodulator circuit of claim 1 wherein the product detector means includes a four quadrant multiplier.

6. The demodulator circuit of claim 5 wherein the four quadrant multiplier includes a Gilbert cell.

7. The demodulator circuit of claim 1 wherein the second signal is a version of the first signal.

* * * * *